United States Patent [19]

Brady et al.

[11] 4,385,967

[45] May 31, 1983

[54] ELECTROPLATING APPARATUS AND METHOD

[75] Inventors: Joseph M. Brady, Huntingdon; Franz R. Cordes, State College, both of Pa.; Klaus H. Gedrat, Berlin, Fed. Rep. of Germany; Daniel L. Goffredo, Riverton, N.J.; Walter Meyer, Berlin, Fed. Rep. of Germany; Conrad D. Shakley, Spring Mills, Pa.

[73] Assignee: Chemcut Corporation, State College, Pa.

[21] Appl. No.: 309,180

[22] Filed: Oct. 7, 1981

[51] Int. Cl.³ .................... C25D 7/06; C25D 17/06; C25D 17/28; C25D 21/10

[52] U.S. Cl. .................... 204/27; 204/198; 204/273; 204/275

[58] Field of Search .......... 204/198, 202, 275, 276, 204/273, 274, 27

[56] References Cited

U.S. PATENT DOCUMENTS

| | | | |
|---|---|---|---|
| 2,708,181 | 5/1955 | Holmes | 204/28 |
| 3,575,829 | 4/1971 | Germain | 204/141 |
| 3,616,423 | 10/1971 | Faust | 204/198 |
| 3,649,507 | 3/1972 | Welter | 204/202 |
| 3,657,097 | 4/1972 | Baldock | 204/202 |
| 3,723,283 | 3/1973 | Johnson | 204/206 |
| 3,746,630 | 7/1973 | Kosowsky | 204/206 |
| 3,799,861 | 3/1974 | Di Pietro | 204/279 |
| 3,848,326 | 11/1974 | Lehtovaara | 29/525 |
| 3,898,151 | 8/1975 | Nessar | 204/300 |
| 3,933,615 | 1/1976 | Levenson | 204/275 |
| 3,951,761 | 4/1976 | Bohringer | 204/15 |
| 3,966,581 | 6/1976 | Holte | 204/202 |
| 3,970,540 | 7/1976 | McBain | 204/297 W |
| 3,982,321 | 9/1976 | Kasper | 29/624 |
| 3,996,127 | 12/1976 | Rautimo | 204/281 |
| 4,003,805 | 1/1977 | Schaer | 204/27 |
| 4,029,564 | 6/1977 | Higuchi | 204/224 R |
| 4,035,245 | 7/1977 | Danneels | 204/15 |
| 4,064,019 | 12/1977 | Eidschun | 204/15 |
| 4,077,865 | 3/1978 | Muller | 204/297 W |
| 4,078,982 | 3/1978 | Eidschun | 204/224 R |
| 4,124,454 | 11/1978 | Shang | 204/27 |
| 4,132,617 | 1/1979 | Noz | 204/206 |
| 4,155,815 | 5/1979 | Francis | 204/15 |
| 4,160,703 | 7/1979 | Bird | 204/15 |
| 4,162,952 | 7/1979 | Tribout | 204/224 R |
| 4,162,955 | 7/1979 | Schregenberger | 204/299 EC |
| 4,176,035 | 11/1979 | Pedone | 204/205 |
| 4,186,062 | 1/1980 | Eidschun | 204/15 |
| 4,217,919 | 8/1980 | Faunce | 134/133 |
| 4,236,990 | 12/1980 | King | 204/275 |
| 4,244,833 | 1/1981 | Tomaszewski | 252/101 |

FOREIGN PATENT DOCUMENTS

| | | | |
|---|---|---|---|
| 32530 | 11/1980 | European Pat. Off. | 204/198 |
| 3001726 | 8/1981 | European Pat. Off. | 204/198 |
| 2856460 | 7/1980 | Fed. Rep. of Germany | 204/198 |

Primary Examiner—T. M. Tufariello
Attorney, Agent, or Firm—Paul & Paul

[57] ABSTRACT

An electroplating apparatus and method is provided, whereby generally flat workpieces, such as metal plates and the like may be electroplated, on a continuous basis, automatically and without manual intervention. The workpieces are delivered horizontally through a bath of electrolyte. They are conveyed through the bath by being engaged by driven contact wheels that also serve as one of the electrodes. The other electrode is in the bath electrolyte solution. As the workpieces are delivered through the bath, they are engaged and disengaged by the contact wheels, but are always in engagement with contact wheels for not only continuous conveyance, but for continuous electrical connection therewith. A particular slide mount is provided for holding an opposite side of the plate as the plate is carried along its flow path, and this mount is adjustably positionable to accommodate different width workpieces. Solution flow through the electrolyte bath is provided on a continuous basis, and both agitates and replenishes the electrolyte solution. Dams are created at ends of the flow path, by the action of squeezing rollers, to prevent passage of electrolyte. Wipers are provided for preventing the turbulence of newly-delivered electrolyte in the bath zone from immediately contacting the contact wheels. Other features are also provided.

20 Claims, 9 Drawing Figures

Fig. 1

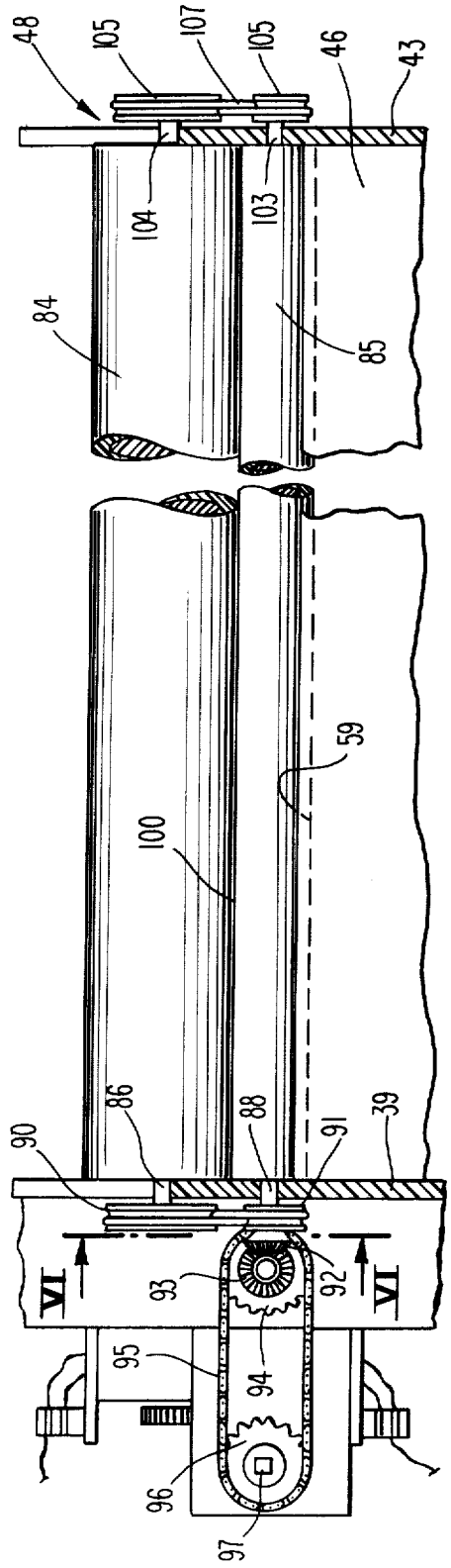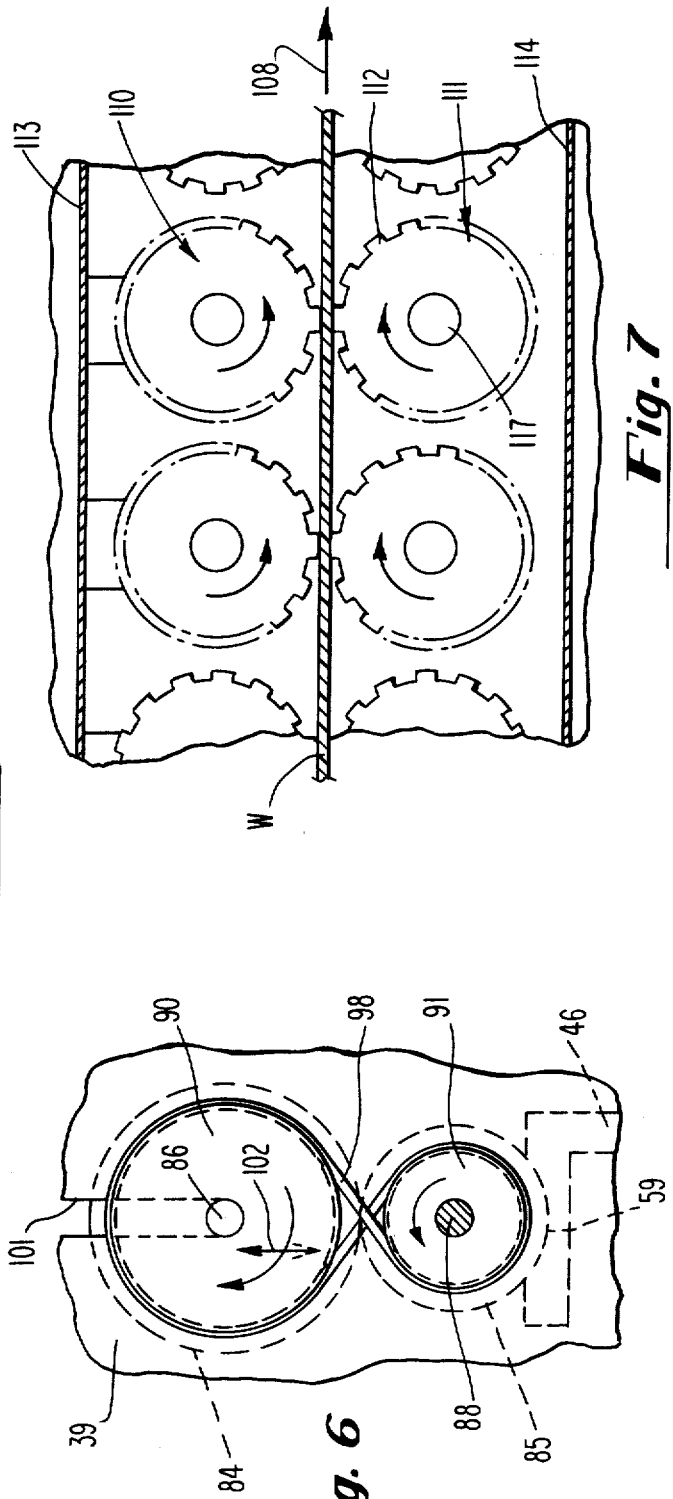

ELECTROPLATING APPARATUS AND METHOD

BACKGROUND OF THE INVENTION

In the prior art, it is well known to electroplate objects, including panels, plates that will be used as printed circuit boards, and various workpieces in general, by immersion techniques, in tanks of the batch type. Where time considerations and continuity of production are not critical, such techniques are highly desirable.

It is also known to electroplate individual articles by dragging them through a solution of electrolyte, generally by means of manually clamping the articles from above, by means of tabs, or plate ends that extend up out of the electrolyte solution. This offers the disadvantages of necessary manual activity, and additionally the protruding tabs do not become electroplated.

Other techniques have been developed for continuous electroplating, for example, of elongated, substantially continuous sheets of material, where problems of making and breaking electrical connection with the material to be electroplated, would not occur. Such techniques do not really address the problem of continuously electroplating in an electrolyte bath, of individual or discrete planar workpieces, of automatic feeding without manual connection and disconnection, and of good electrical and mechanical connection as the workpieces are delivered through the bath.

THE PRESENT INVENTION

The present invention is directed toward providing an apparatus and method for continuous and automatic electroplating of generally flat workpieces by their horizontal delivery through a bath, wherein the problems of electrical connection and disconnection are avoided, and wherein reliable mechanical delivery of articles through the bath is provided.

SUMMARY OF THE INVENTION

The present invention provides, in a continuous electroplating process directed toward electroplating individual or discrete workpieces, on an automatic basis, the mechanical conveyance of workpieces through the bath, by many serial mechanical engagements and disengagements of the drive components, while always driving the workpiece, and by many serial electrical engagements and disengagements of the workpiece, while always maintaining electrical connection with the workpiece as it is being delivered through the bath, so that the workpiece will always be electrically connected as an electrode. Various supplementary features assist in this general approach.

Accordingly, it is a primary object of this invention to provide a novel apparatus for electroplating discrete workpieces, by their horizontal conveyance through a bath, without manual connection and disconnection problems.

It is another object of the present invention to provide a method of electroplating workpieces continuously and automatically.

It is a further object of this invention to accomplish the above objects by engaging the workpieces automatically and serially, by means of contact wheels, as they are moved through, but immersed in the bath, with the wheels in the aggregate maintaining a continuous drive of the workpieces through the bath and a continuous provision of electrical energy so that the workpieces function as electrodes as they go through the bath, but at the same time with the wheels individually and serially making and breaking mechanical drive contact with the workpieces and electrical connection with the workpieces, as they travel through the bath.

It is a further object of this invention to provide a means for creating turbulence in the electrolyte solution, and for replenishing the solution.

It is a further object of this invention to provide a means for shielding electrolyte spray from contact wheels that provide electrical connection to the workpieces.

It is another object of this invention, to allow for various sized workpieces to be electroplated, with a simple adjustment for workpiece size.

It is another object of this invention to provide an efficient means of generating the necessary electrical potential between the electrodes.

It is another object of this invention to provide suitable and novel inlets and outlets for workpieces at each end of the bath, without excessive loss of electrolyte at ends of the bath.

Other objects of the invention will be readily understood by reference to the paragraphs above, the following brief descriptions of the drawing figures, the detailed descriptions of the preferred embodiments, and the appended claims.

BRIEF DESCRIPTIONS OF THE DRAWING FIGURES

FIG. 1 is a longitudinal sectional view, taken through the apparatus of this invention, generally along the line I—I of FIG. 2.

Figure 3:
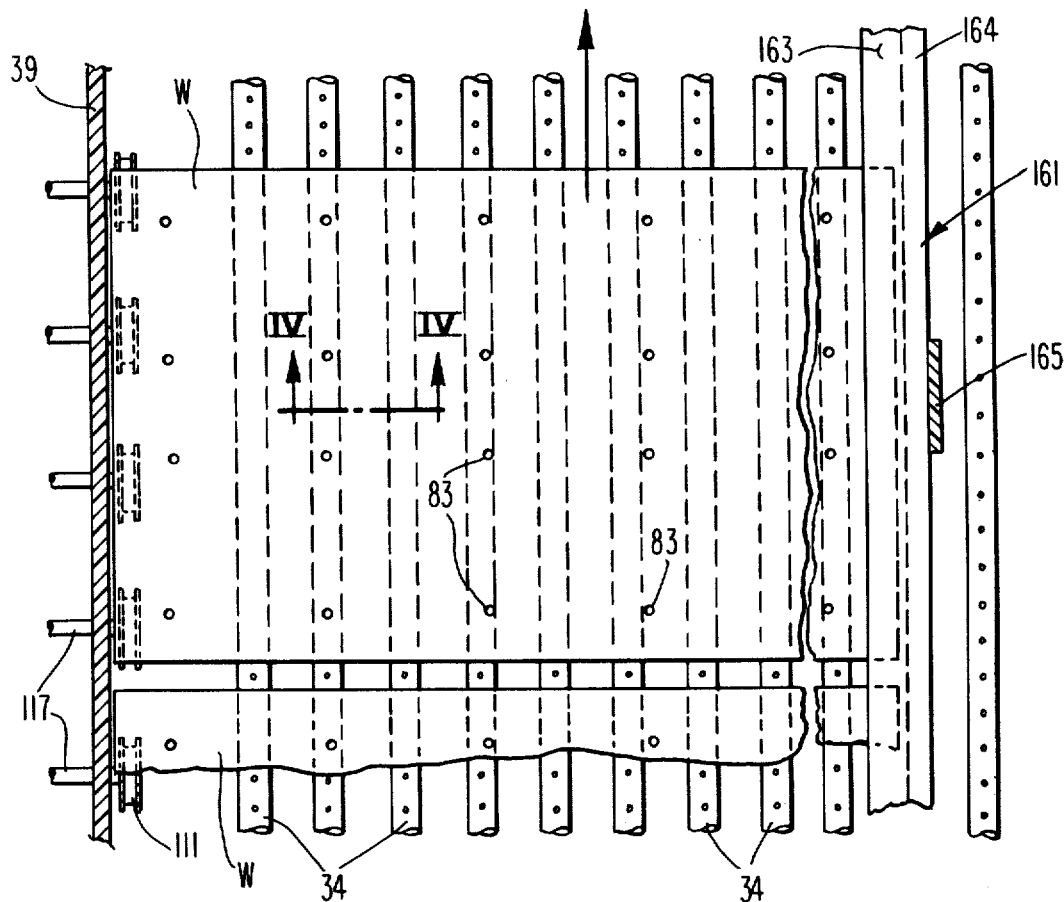
FIG. 3 is a further enlarged fragmentary plan view of a portion of a workpiece being conveyed along its flow path, taken from just above the workpiece, and generally along the line III—III of FIG. 2.
Figure 4:
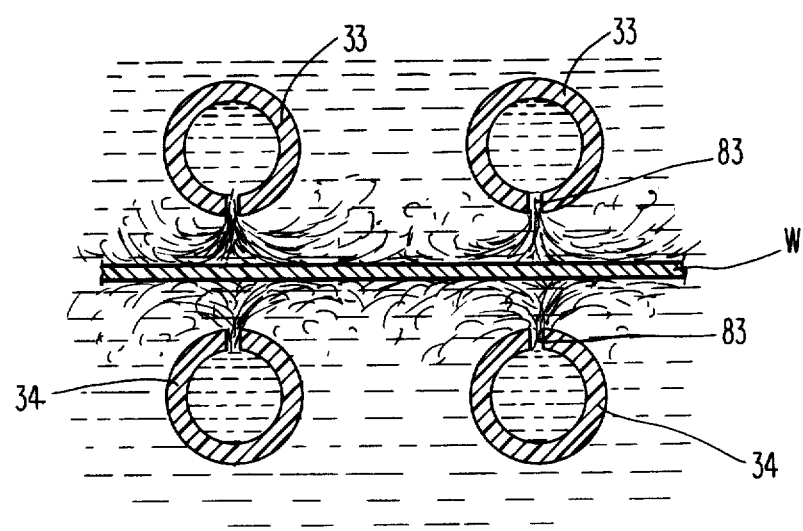

FIG. 4 is a further enlarged transverse sectional view taken through electrolyte delivery tubes above and below the path of travel of workpieces through the apparatus, and wherein there is schematically illustrated the turbulence provided by delivery of electrolyte toward workpieces as they pass between delivery tubes along their flow path, with the view of FIG. 4 being taken generally along the line IV—IV of FIG. 3.

Figure 1:
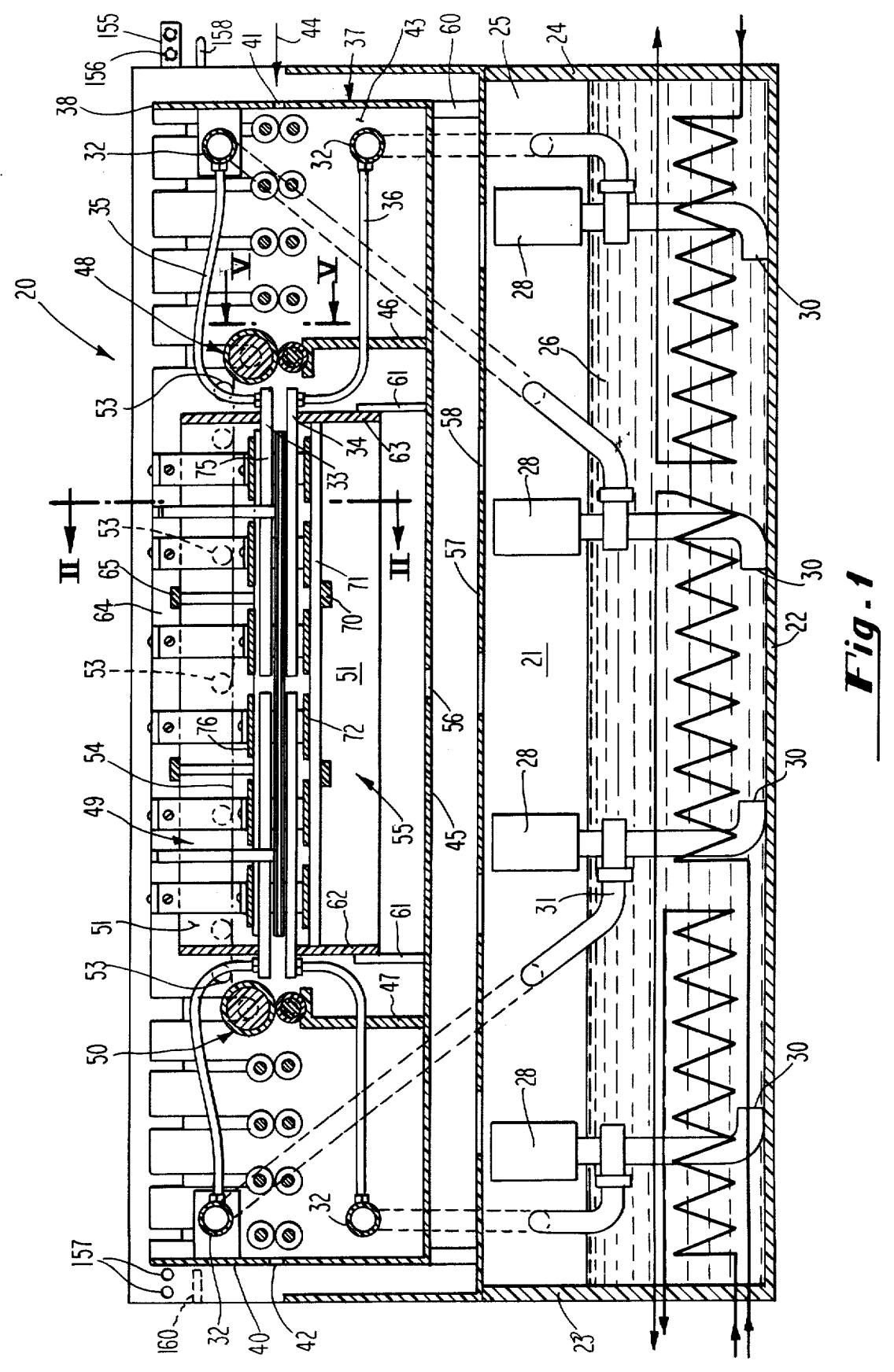

FIG. 5 is an enlarged fragmentary transverse sectional view, taken through the apparatus illustrated in FIG. 1, generally along the line V—V, and wherein the dam at the inlet end of the bath zone is best illustrated.

FIG. 6 is an enlarged fragmentary end view of the drive interconnection between upper and lower dam rolls, taken generally along the line VI—VI of FIG. 5.

Figure 2:
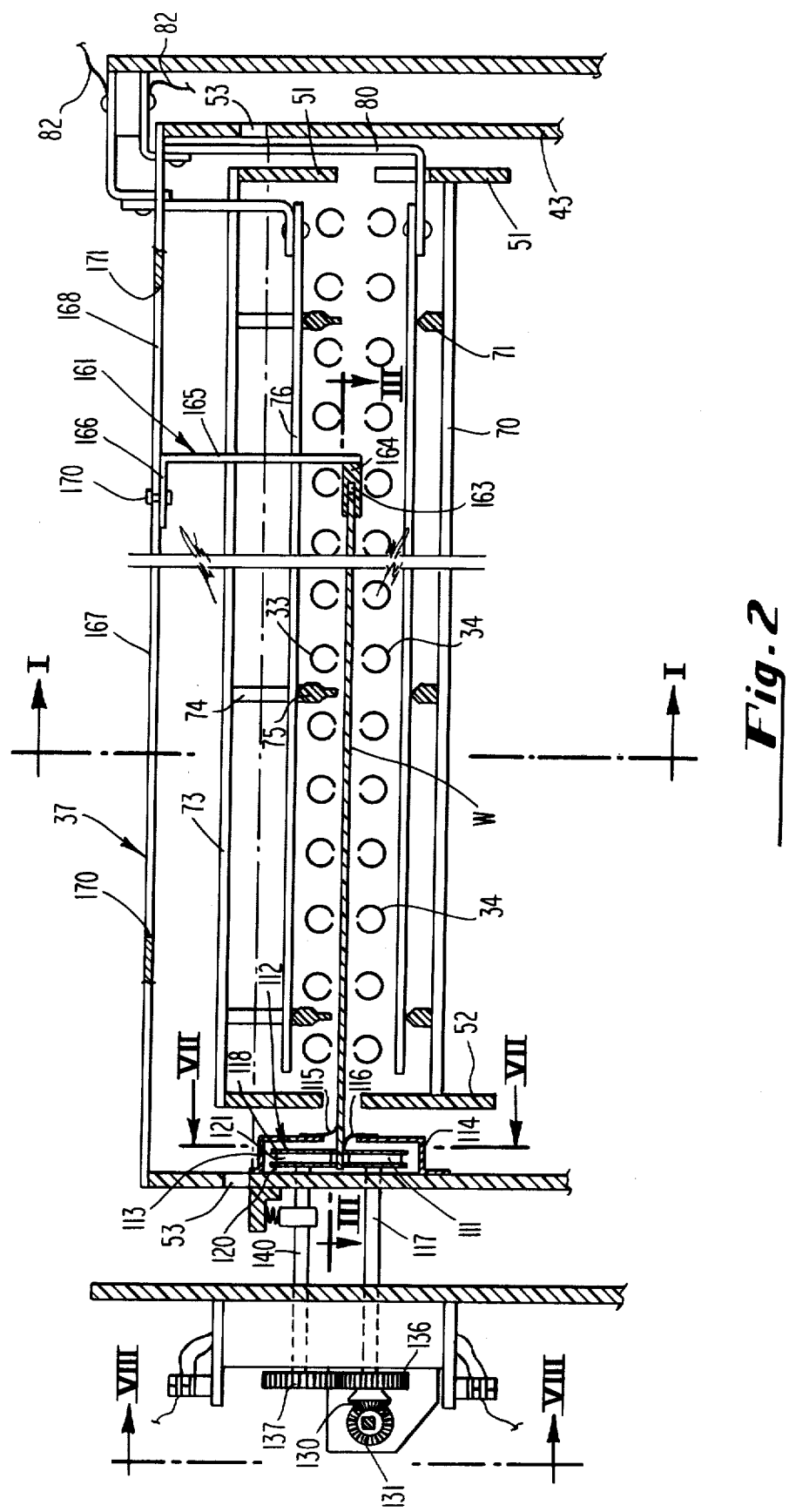
FIG. 2 is an enlarged fragmentary transverse sectional view, through a portion of the apparatus of FIG. 1, taken generally along the line II—II of FIG. 1, and wherein the electrolyte delivery tubes, the workpiece conveying means, the adjustable support for the non-driven side of the workpiece, inter alia, are clearly illustrated.

FIG. 7 is an enlarged fragmentary vertical sectional view, taken through the shrouds that overlay the contact wheels, generally along the line VII—VII of FIG. 2, wherein contact of the contact wheels with a workpiece being conveyed therebetween is clearly illustrated.

Figure 8:
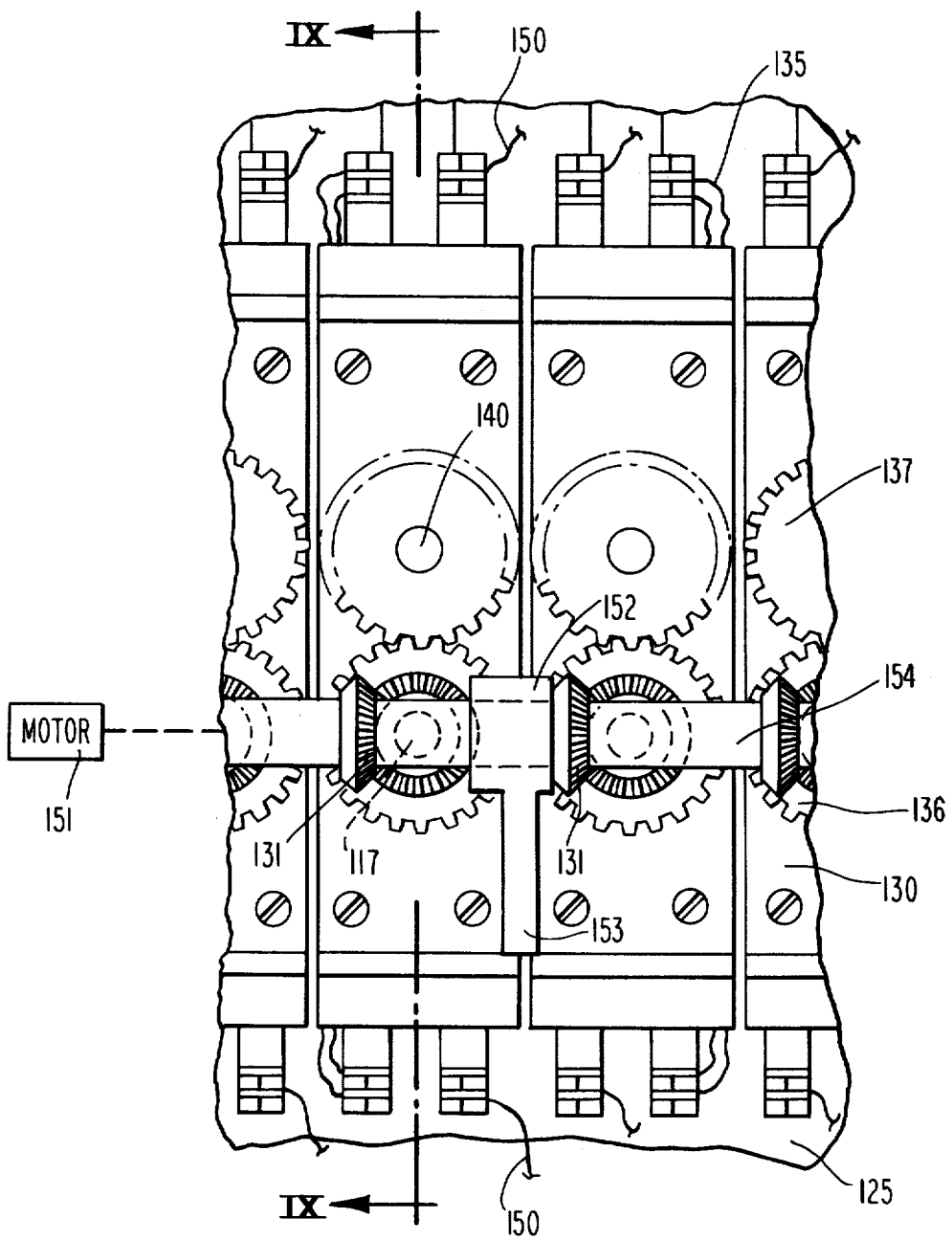

FIG. 8 is an enlarged fragmentary vertical elevation of the drive for the contact wheels, taken generally along the line VIII—VIII of FIG. 2.

Figure 9:
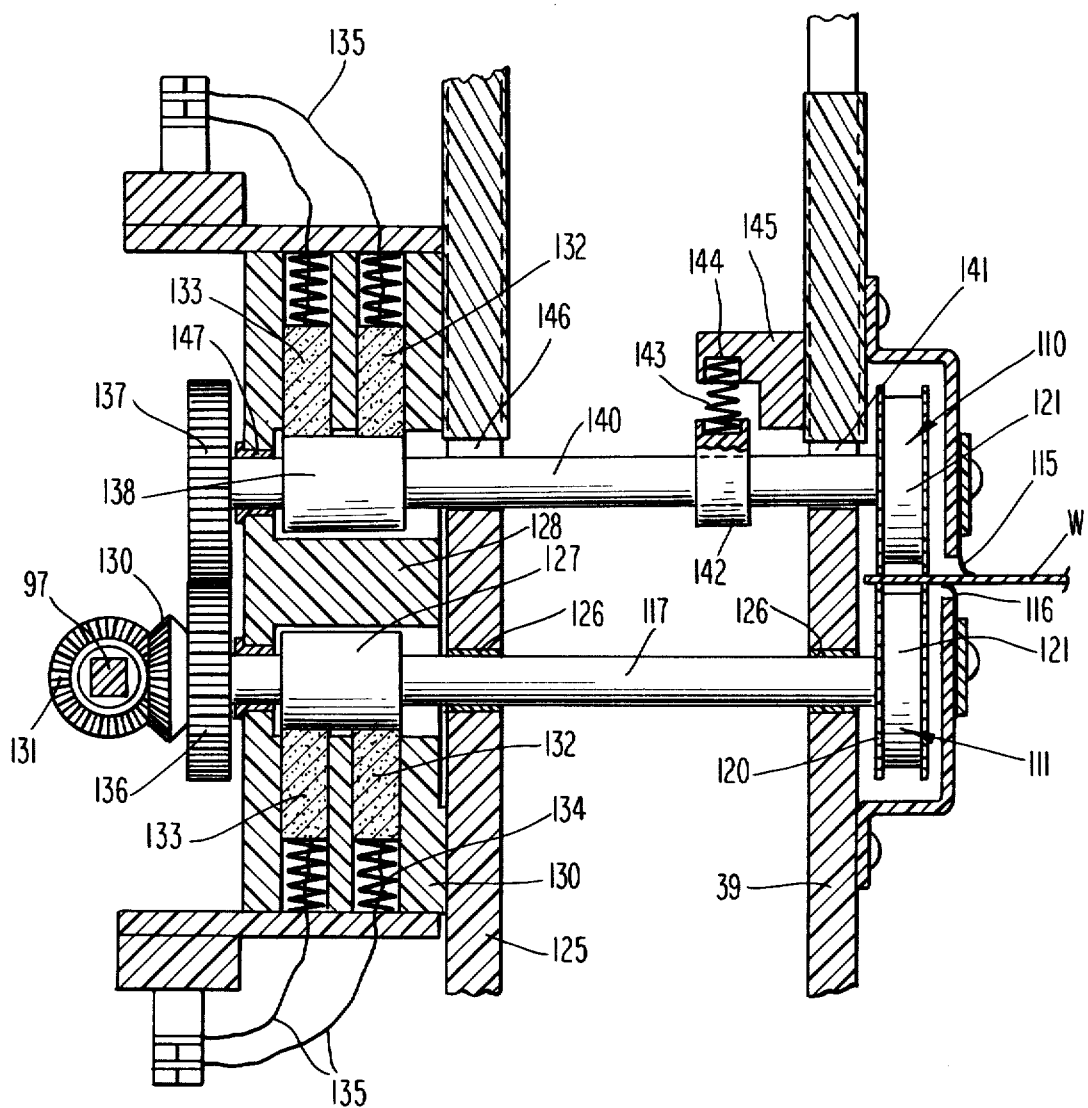

FIG. 9 is a fragmentary transverse sectional view taken generally along the line IX—IX of FIG. 8, and wherein the spring-loaded feature of the contact wheels is illustrated, as well as the shroud wipers and the electrical connections of the wiper wheels.

DESCRIPTIONS OF PREFERRED EMBODIMENTS

Referring now to the drawings in detail, reference is first made to FIG. 1 of the drawings, wherein the apparatus generally designated by the numeral 20, is illustrated.

The apparatus 20 has at its lower end, a sump 21 defined by lower wall 22, left and right walls 23 and 24, respectively, and front and back walls 25. The sump 21 is the reservoir for the electrolyte solution 26. A plurality of heat exchangers 27, of the water circulation type are provided, with suitable water inlet and outlet connections (not shown), whereby temperature-controlled (not shown) cool water may be delivered through the pipelines of the exchangers 27, for cooling without liquid-to-liquid contact with the electrolyte solution 26.

A plurality of electrically operated pumps 28 are disposed in the sump 21, each having a submerged inlet 30 and an upper outlet 31.

The outlets of the electrolyte pumps are connected to upper and lower electrolyte manifolds 32. The manifolds 32 feed upper and lower delivery tubes 33 and 34, respectively, through respectively associated upper and lower electrolyte conduits 35 and 36, that in turn are connected to associated manifolds 32. The manifolds 32 are carried in an upper tank generally designated by the numeral 37, having inlet and outlet end walls 38 and 40, respectively, with respectively associated workpiece slotted inlet opening 41 and slotted outlet opening 42, for passage of a workpiece such as that W, from inlet 41, to outlet 42, in the direction of the arrow 44 at the right end of FIG. 1.

The tank 37 has a bottom 45 between walls 39 and 43, that forms the bottom of the bath zone, the ends of which are comprised by inlet and outlet bath zone walls 46 and 47, respectively, with respectively associated inlet and outlet dams 48 and 50 (later to be described in detail). The side walls of the bath zone are walls 39 and 43. The side walls 39 and 43 are each provided with a large number of overflow ports 53, for maintaining a bath fluid level 54 as illustrated in FIG. 1.

From the foregoing, it will be apparent that electrolyte is pumped by means of pumps 28, from the sump 21, up through discharge lines 31, to manifolds 32, and then delivered by conduits 35 and 36, to discharge tubes 33, at a high rate of replenishment, both for purposes of maintaining the liquid level 54, and for providing agitation to the electrolyte as will be described more fully hereinafter. The rate of replenishment is sufficiently high that, notwithstanding some (preferably minimal) loss of electrolyte through the inlet and outlet openings at the dams 48 and 50, as workpieces enter and leave the bath zone, and notwithstanding some passage of electrolyte through the openings 53 in the walls 39 and 43, and further notwithstanding some passage of electrolyte through additional exit ports 56 that may be provided in lower wall 45 of tank 37 the level 54 is maintained. It will be noted that the upper wall 57 of sump 21 has large receiving ports 58 therein, to accommodate ready receipt of electrolyte from openings 56, from discharge ports 53, etc.

It will further be apparent, that the tank 37 is constructed as a unit separate from the sump and is supported on standards 60 carried by the upper wall 57 of the sump 21, but that if desired, the bottom 45 for the tank 37 could be eliminated, as well as the upper wall 57 of the sump 21, if it were desired to construct the tank 37 and sump 21 as a unit. In some instances, where disassembly may periodically be desired, for relocation or the like, it may be preferable to construct the units as shown. In other cases, where construction will be relatively permanent, the units 37 and 21 would be constructed as a single unit, absent the members 45 and 57. In any event, the overflow through the openings 53 of walls 39 and 43, will be back into the sump 21. When a bottom 45 is provided for tank 37, suitable supports 61 will be provided for the lower generally rectangular frame 55 that is defined by side walls 51 and 52, and end walls 62 and 63. The frame member 49 comprising the upper ends of walls 51, 52, 62 and 63, is supported from side walls 64, by means of suitable supports 65 fixedly secured to walls 51 by means not shown. Distribution tubes 33 and 34 are carried by frames 49 and 55 at the flow path opening therebetween, by suitable means, not specifically shown. Any conventional mounting attachments will suffice.

A lower anode support bar 70, is shown in FIG. 2, carried between vertical plates 51 and 52, as shown, and in turn carries lower anode holders 71, as illustrated. On the longitudinally disposed holders 71, are carried the transversely disposed lower anodes 72. Similarly, upper support bar 73, has, depending therefrom, supports 74 that in turn, carry upper anode holders 75, each of which are longitudinally disposed and in turn carry thereon transversely disposed upper anodes 76. The anodes 72 and 76 are generally copper, as will be discussed more fully hereinafter. The anode holders 71 and 75, the support bars 70 and 73, the support members 74, as well as the various wall members, 39, 43, 51, 62, 63, 47, 46, dams 48 and 50, tubes 33 and 34, and all other members not essential for functioning as anodes or cathodes, are either of a nonconductive material, if economically feasible, or are covered with a dielectric coating, so as not to function as anodes or cathodes during the operation of this invention.

The anodes 72 and 76 have suitable electric connections through conductors 80 and 81, respectively (preferably coated as discussed above), to suitable power sources by appropriate electrical connections 82.

With particular reference to FIGS. 3 and 4, it will be noted that the distribution tubes 33 and 34, have discharge openings 83 therein, for delivery of electrolyte, with agitating action, to upper and lower surfaces of the workpieces W, as illustrated.

The high rate of flow of electrolyte solution through the distribution tubes 33 and 34, aside from replenishing the bath zone to the desired level 54, also provides sufficient agitation for the solution for maintaining substantial uniformity in composition and charge density. As an alternative, the tubes 33 and 34 could be oscillated horizontally, or left-to-right, as viewed in FIG. 1 (not shown), if desired, as either a separate, or additional means for providing turbulence to the solution, if desired.

With particular reference to FIG. 5, the inlet dam 48, to the bath zone, is more clearly illustrated, in sliding contact in a groove 59 in the upper end of wall 46. The dam 48, essentially comprises upper and lower rollers 84 and 85 respectively, extending between vertical side walls or frame members 39 and 43, with the cylinders 84 and 85, having respectively associated shaft protrusions 86 and 88, with respectively associated pulleys 90 and 91 carried thereon. The pulley 91 is driven by attached bevel gear 92, that in turn, is driven by mating bevel gear 93, that is carried on sprocket 94, with the sprocket 94 being driven by sprocket chain 95, that in turn, is driven by sprocket 96, that, in turn is driven by main drive rod 97, running substantially the length of the apparatus 20, along one side thereof. The pulley 91 is connected to the pulley 90 by means of a stretchable, rubber or like drive belt 98, arranged in figure "8" configuration, as illustrated in FIG. 6, for providing a drive to the cylinder 84, that is in the same direction of drive, with respect to conveyance of the workpiece W therethrough, at the nip 100 between the cylinders 84 and 85. The shaft 86 is slideably carried in vertical slotted hole 101 in side wall 39, for accommodating upward movement of shaft 86 therein, for in turn accommodating upward movement of cylindrical roller 84, as workpieces W of various thicknesses pass through the nip 100. Accordingly, the cylinder 84 is capable of limited vertical movement in the direction of the double-headed arrow 102, as shown in FIG. 6. Additionally, the resilient member 98 effects an urging-together of the rollers 84 and 85, for maintaining a type of rolling but sealing engagement at the nip 100, for preventing passage therethrough of electrolyte solution. Accordingly, the resilient drive member 98 is of the rubberband type for accomplishing these ends. The right-most end of the apparatus as viewed in FIG. 5, will likewise be provided with shaft ends 103 and 104, with respectively associated pulleys 105 and 106, drivingly interconnected by a rubberband 107 or the like, also arranged in figure "8" configuration, although the shaft end 103 need not be separately driven by bevel gears or the like.

With reference to FIG. 7, it will be seen that the workpiece W is being conveyed from left-to-right, in the direction of the arrow 108 illustrated, and is being driven in that direction by means of simultaneous contact with a plurality of upper contact wheels 110 and lower contact wheels 111, that are being driven counterclockwise and clockwise, respectively, as viewed in FIG. 7. The contact wheels 110 and 111 have serrated peripheries 112, as shown, of stepped configuration, for making good electrical contact with the workpiece W being delivered therethrough. The wheels 110 and 111 provide the drive for the linear motion of a workpiece W moving therethrough, in its flow path, in the direction of the arrow 108, and additionally provide electrical contact with the workpiece W, to enable it to function as a cathode for collecting anodic charges from the anode, through the solution. The wheels 110 and 111 are encompassed in upper and lower shrouds 113 and 114, respectively. The shrouds 113 and 114 are carried on the inner surface of vertical wall 39, connected thereto by any suitable means (not shown) and are provided with attached wiper blades 115 and 116 carried thereby, as illustrated in FIG. 2. Accordingly, the wipers extend in the direction of flow of the workpiece W, from end-to-end of the bath zone, and serve to prevent turbulence of solution emanating from tube openings 83, from splashing against the contact locations of the wheels 110 and 111 with the workpiece W. Accordingly, it will be understood that the shrouds 113 and 114 likewise extend the length of the bath zone for accomplishing this purpose. It will further be understood that the wheels 110 and 111 are constructed of a material for good electrical conductivity with a workpiece passing therebetween.

The wheels, as shown in FIG. 2, are illustrated as each comprising a pair of serrated-edged discs 118 and 120, of the same diameter, connected by a washer 121 of good electrical conductivity, but of reduced diameter as illustrated.

The wheels 111 are carried for rotation on shaft 117, which is mounted for rotation on wall 39, as shown, and in wall 125, with suitable bushings 126 being provided, for accommodating the rotation.

Carried by rotating shaft 117, is a commutator 127, carried in suitable nonconductive housing members 128 and 130. The left-most outer end of the shaft 117, as viewed in FIG. 9, has a bevel gear 130 carried thereon, that, in turn, is in meshed engagement with a mating bevel gear 131, that, in turn, is carried by the main drive rod 97, for rotation therewith. It will thus be seen that rotation of the main drive rod 97, rotates the commutator 127, and the contact wheel 111. The structure of the commutator 127 can take various conventional forms, and will operate such that its rotation past brushes 132 and 133, spring-mounted thereagainst by means of springs 134 disposed in the support member 130 will result in delivery of a cathodic charge to the wheel 111, in that the brushes 132, 133, are appropriately electrically connected by means of suitable leads 135, to a suitable power source. A spur gear 136 carried on shaft 117, for rotation therewith, drives a meshed spur gear 137, that in turn, drives a commutator 138 and its shaft 140, as well as a contact wheel 110 mounted thereon. The commutator 138 is likewise provided with spring-loaded brushes, suitably electrically connected, as shown, for likewise rotating the wheels 110, and electrically charging them to function in a cathodic manner.

In order to accommodate workpieces W of different thicknesses, the wheels 110 are mounted so as to allow them limited vertical movement. To this end, the shaft 140 is not carried in a bushing in vertical plate 39, but an enlarged clearance hole 141 is provided for accommodating the limited vertical movement of the shaft 140 therein, in an upward direction. A bushing 142 is carried on the shaft 140, for rotation of the shaft 140 therein, but with the bushing 142 being spring-urged downwardly by means of a spring 143, that in turn, has its upper end fixedly mounted in a blind hole 144 of a rigid support 145 carried on the vertical side wall 39. Likewise, a clearance hole 146 is provided in vertical 125 to accommodate limited upward vertical tilting of the shaft 140. Similarly, bushing 147 may be a somewhat loose fit (not shown) if desired, in order to accommodate this upward angular movement of the right-most end of the shaft 140 to accommodate different thicknesses of workpieces.

It will thus be seen that each contact wheel 110 or 111, is provided with its own power source, in the preferred embodiment. It will further be noted that the leads 135, while electrically connecting the brushes 132 and 133 to a suitable junction, in turn will be connected by suitable lead line 150 to a source of power. Such power source will generally be an AC supply delivered through a rectifier, for converting the applied voltage to DC.

With reference to FIG. 8, it will be seen that a suitable motor 151 drives the drive rod 97, on which the gears 131 are mounted. The drive rod is supported by a bushing 152, mounted at 153, to the machine frame 125.

It will be noted that the gears 131 are provided with suitable spacer members 154. These spacer members, gears 131, and drive rod 97, may preferably be constructed in accordance with the drive taught in U.S. Pat. No. 4,015,706. This especially facilitates the connection of various modules of apparatus 20, together, one to the other, as modular units. To this end, a mounting block 155 may be provided at the right-most end of the unit as illustrated in FIG. 1, with a plurality of tapped holes 156, if desired therein, for use of a threaded connector (not shown), to connect the mounting block 155, to mounting holes of a next adjacent module (not shown). Similarly, at the left end of the apparatus of FIG. 1, mounting holes 157 are illustrated, again to receive a threaded connector from the mounting block (not shown) of the next adjacent module. Also, the right and left ends (respectively) of the apparatus illustrated in FIG. 1, most particularly on the exterior vertical frame members, such as 125, may be provided with dowel pin and hole members 158 and 160, respectively, of the male/female alignment pin type, for facilitating alignment together of adjacent modules. To this end, the teachings of U.S. Pat. No. 4,015,706, may be employed if desired.

With reference to the right-most end of the workpiece W, as illustrated in FIG. 2, it will be seen that a workpiece support generally designated by the numeral 161 is employed, the support sufficing to slidingly engage the right-most end of the workpiece W as illustrated in FIG. 2, as the workpiece W slides through a track or groove 163 therein. The groove 163 is disposed in an elongated member 164 that essentially runs from inlet to outlet ends of the bath zone, between the dams 48 and 50, parallel to the path of flow of workpieces to the apparatus. The elongated support member 164 is supported vertically at the desired location, by vertical support member 165, that in turn depends from a horizontal support 166 that is carried by upper plate 167, in a slotted hole 168 thereof. A suitable thumbscrew, and threaded member 170, will serve to engage in the slotted hole 168, for facilitating adjustably positioning the support 161, for handling boards or plate-like members of narrow width, up to boards of wide width, between ends 170 and 171 of the slot 168.

It will be noted that driven contact wheels are located at the inlet end of the machine (as illustrated in FIG. 2) between the inlet slot 41 and the dam 48, as well as the outlet end of the machine between the dam 50 and slot 42, as well as, between the dams 48 and 50, as is apparent from the discussion above. It will be noted, that in some instances, it may be desirable that the electrical energy supplied to contact wheels at the inlet and exit ends of the machine may be different than that applied to contact wheels in the bath zone, and that the separate power source for each contact wheel, as is disclosed for example in FIG. 8 hereof, allows such individual treatment, even for individual contact wheels. In most cases, however, the power supplied to contact wheels in the bath zone, will be set to achieve the same current density for all contact wheels in the bath zone. Similarly, different settings may achieve an entry area current density for contact wheels at the entry end of the apparatus, and even different current density may be achieved at the exit area by appropriate electrical sourcing.

A filter (not shown) will preferably be provided in the sump 21, for filtering out contaminants and the like. An example of a suitable type of filter, may be the removable filter disclosed in U.S. patent application Ser. No. 3,776,800, the disclosure of which is herein incorporated by reference. Also, it will be noted that the cooling liquid (generally being, but not limited to water), that is delivered through the heat exchanger coils 27, may be provided with suitable thermostatic controls (not shown), as desired.

Mention has been made earlier of the desire to construct various parts of the equipment that may come into contact with the electrolyte solution, either of a dielectric material, or to coat those components of equipment with a nonconductive coating, and it would be understood that such will be done wherever possible, subject only to accomplishing the ends of this invention, of electroplating, preferably from the anode to the cathodic workpieces. Similarly, non-metallic components, such as drive rods, etc. will be used wherever possible.

It will also be noted that the resilient mount for the upper contact wheels 110, as disclosed in FIG. 9 of the drawings and the specification portions related thereto, will be usable, not only for accommodating boards or other workpieces W of different thicknesses, but also to allow for continued operation, even when there is buildup by electrodeposition of metal on the peripheries of the contact portions of the contact wheels 110 and 111.

It will be noted, that while the anodes disclosed herein are the copper bars 72 and 76, running transversely of the machine, other techniques for constructing anodes may be employed. For example it is known to use baskets of copper balls, as anodes, with the baskets being electrically connected to a suitable source, and transmitting the electrical energy by adjacent contact, one to the other, between the copper balls, and that the copper balls can thereby function as anodes. For example, a titanium basket, with several layers of copper balls could be used below the workpiece, in lieu of the bars 72, with another titanium basket having balls therein above the workpiece, in lieu of the copper bars 76. One advantage of this, would be, the ease of replacement of the copper balls, as they deteriorate during the electroplating process, merely by dropping additional balls into the basket, rather than requiring replacement of the perhaps inconveniently located anode bars 76 and 72.

It will be appreciated that various optimum processing conditions may be utilized, for optimizing the electrodeposition process. For example, if it is desired to prevent burning of the contact wheels on the workpieces, the electrodeposition will be as uniform as possible in depositing copper on the workpieces. To do this, a high flow rate and high rate of electrolyte replenishing should be realized. Additionally, while it will be understood that the essence of this invention is that of electrodeposition generally, where printed circuit boards and the like are being deposited with copper, it will be understood that the anodes are copper. When the electrodeposition is of copper, the bath will generally be a solution of copper sulfate, sulfuric acid, and suitable and preferred additives, to achieve the desired ampers/area of copper deposition, or applied density. Also, various other factors, such as rate of circulation, and temperature of the bath should be controlled, for optimum electrodeposition. Furthermore, other parameters such as anode/cathode separation distance should be considered, and established for the workpieces that are desired to be deposited. Even further, the relative areas of anode-to-cathode should be considered, and optimized.

It will be apparent from the foregoing that various modifications may be made in the details of construction, as well as in the use and operation of the apparatus in accordance with the present invention, all within the spirit and scope of the invention as defined in the appended claims.

What is claimed is:

1. Apparatus for electroplating discrete generally planar workpieces comprising:
   means defining a bath zone of electrolyte solution;
   conveying means for delivering the discrete planar workpieces through the bath zone in a continuous motion along a generally horizontal flow path submerged in the bath zone and with the workpieces in generally horizontal disposition;
   anode electrode means in said bath zone;
   cathode electrode means in said bath zone;
   and means for generating an electrical potential between said anode electrode means and said cathode electrode means;
   said conveying means including a plurality of continuously driven contact wheels disposed along said flow path; said wheels comprising one of said electrode means; said wheels further comprising means for
   (a) automatically and serially engaging the workpieces for delivery along the path and for automatically and serially releasing the workpieces as they are delivered along the path, and
   (b) automatically and serially making clamping electrical connection with said workpieces and automatically and serially releasing the workpieces from electrical connection as they are delivered along the path.

2. The apparatus of claim 1, wherein said wheels are the cathodes.

3. The apparatus of claim 1, wherein said wheels include upper wheels and lower wheels mounted in urged-together opposition to each other for engaging moving workpieces therebetween, including means for accommodating movement away from each other upon receiving workpieces therebetween.

4. The apparatus of claim 1, wherein said wheels are disposed along only one side of said path, with workpiece support means being disposed along the other side of said path, for supporting the other side of the workpieces as they travel along the path.

5. The apparatus of claim 4, including means for adjustably positioning the support means at different positions along the path from said wheels, to accommodate workpieces of various widths.

6. The apparatus of claim 4, wherein said support means includes a slide member of channel configuration for receiving therein workpiece edges, in sliding relation.

7. The apparatus of claim 1, wherein combined means are provided in said bath zone for continuously both agitating and replenishing the electrolyte solution.

8. The apparatus of claim 7, wherein said combined means include electrolyte delivery tubes in said bath zone above and below said path, with openings along said tubes facing toward said path.

9. The apparatus of claim 7, wherein said combined means comprise electrolyte delivery tubes in said bath zone, located along said flow path, with electrolyte discharge openings along said tubes, with electrolyte overflow means so located as to define an upper limit to said bath zone for discharge of excess electrolyte therefrom, and electrolyte collection sump means for receiving excess electrolyte discharged from said bath zone, including means for recirculating electrolyte from said sump means to said bath zone.

10. The apparatus of claim 9, including heat exchanger means in said sump for cooling the electrolyte.

11. The apparatus of claim 1, wherein electrolyte supply means is provided in said bath zone for supplying electrolyte thereto, wherein said contact wheels are disposed along a side of said flow path, with shroud means provided, substantially completely shrouding said wheels from the main part of said bath zone except for a slotted opening means for accommodating the passage of workpieces therethrough, and with wiper means provided along said slotted opening means and carried by said shroud means for slidingly engaging and wiping along workpieces being delivered along said path, for limiting contact of said wheels with electrolyte being supplied from said supply means.

12. The apparatus of claim 1, wherein said bath zone is provided with dam means at inlet and outlet ends of said flow path; said dam means at at least one end comprising a pair of rotatable rollers disposed transversely of said flow path for accommodating passage of workpieces therebetween; including means resiliently urging said pair of rollers together for sealing engagement of workpieces therebetween for limiting passage of electrolyte between said rollers.

13. The apparatus of claim 12, wherein drive means is provided for said rollers, and wherein the drive means for a roller in said pair also comprises the means for urging the rollers and the pair together.

14. The apparatus of claim 1, wherein said contact wheels are disposed along a side of said flow path, above and below said path; wheel drive members for said contact wheels; means for physically isolating said wheel drive members from electrolyte in said bath zone; common drive means mechanically connecting said drive members; wherein said generating means includes separate generating means for each said contact wheel.

15. The apparatus of claim 2, wherein said anode means are located above and below said flow path, substantially completely along said path in said bath zone.

16. The apparatus of claim 15, wherein said anode means comprise copper bars disposed transversely of said flow path; including nonconductive anode support means in supporting relation to said bars.

17. The method of electroplating discrete generally planar workpieces, one after the other, in a continuous manner, comprising the steps of:
   providing a bath of electrolyte solution;
   generating an electrical potential and delivering it to the solution through electrodes in the solution;
   conveying workpieces through the bath in a continuously generally horizontal motion, while the workpieces are held in generally horizontal disposition;
   while the workpieces are being continuously conveyed through the bath, bringing them into contact between opposed contact wheels along a side of the flow path;
   automatically and serially engaging the workpieces being delivered along the path with the wheels while automatically and serially clamping electrical connection of the wheels with the workpieces;

and automatically and serially releasing the wheels from workpieces as they are delivered along the path, while automatically and serially releasing the workpieces from electrical connection with the wheels as they are delivered along the path.

18. The method of claim 17, wherein the generating step includes creating an electrical potential whereby the contact wheels are cathodic, and providing copper anodes in the bath.

19. The method of claim 17, including the steps of continuously agitating the electrolyte solution while replenishing the solution, by continuously delivering electrolyte solution to the bath, to the locations in the bath above and below the path of workpieces therethrough, while continuously overflowing electrolyte from the bath, followed by delivery of overflowed electrolyte for recirculation.

20. The method of claim 17, wherein the generation of electrical potential between the electrodes, includes separately applying a charge to each contact wheel.

* * * * *